United States Patent [19]

Lane

[11] 4,381,956
[45] May 3, 1983

[54] SELF-ALIGNED BURIED CHANNEL FABRICATION PROCESS

[75] Inventor: Richard H. Lane, San Jose, Calif.

[73] Assignee: Motorola, Inc., Schaumburg, Ill.

[21] Appl. No.: 251,615

[22] Filed: Apr. 6, 1981

[51] Int. Cl.³ .................... H01L 21/20; H01L 21/22
[52] U.S. Cl. .................................... 148/175; 148/187;
 29/576 E; 29/576 B
[58] Field of Search .................. 148/1.5, 175, 187;
 29/576 E, 576 B; 357/50

[56] References Cited

U.S. PATENT DOCUMENTS

| 4,002,511 | 1/1977 | Magdo et al. | 148/175 X |
| 4,062,699 | 12/1977 | Armstrong | 148/1.5 |
| 4,149,915 | 4/1979 | Bohg et al. | 148/1.5 X |
| 4,151,010 | 4/1979 | Goth | 148/187 X |

Primary Examiner—G. Ozaki

Attorney, Agent, or Firm—Robert M. Handy

[57] ABSTRACT

A technique is described for the preparation of buried channels of arbitrary conductivity type in a semiconductor device or integrated circuit containing oxide moats in an epitaxial surface layer. By following a specific sequence of process steps, two mask layers are obtained from a single mask alignment step which permits adjacent regions in the substrate to be doped to different conductivity and type, if desired, prior to the growth of the epitaxial layer. The resulting epitaxial layer has an irregular surface pattern reflecting the shape of the buried structures to faciliate ready alignment with the mask pattern necessary for the production of oxide moats. The resulting structure has a channel buried under the oxide moat region which is used to inhibit the formation of parasitic channels or create a desired channel for device purposes.

7 Claims, 11 Drawing Figures

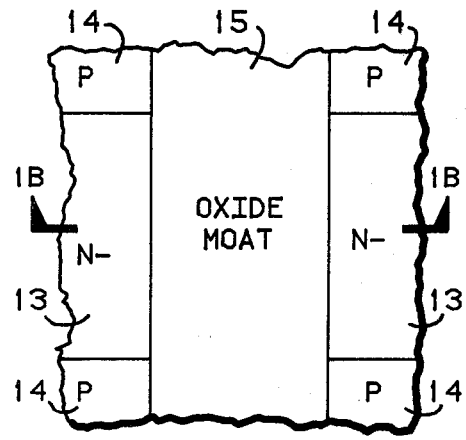
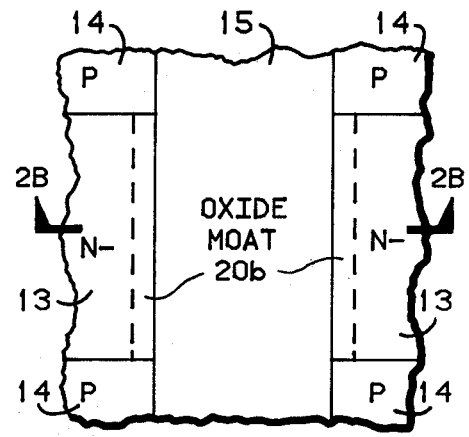
FIG 1A
FIG 2A
—PRIOR ART—
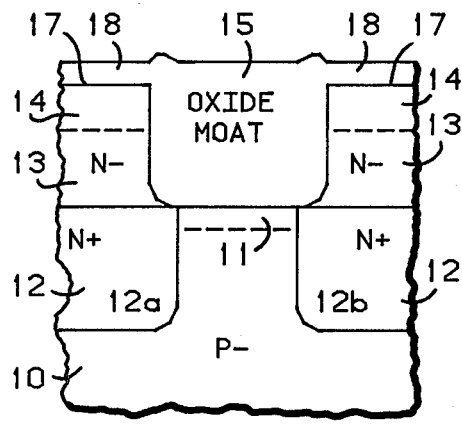
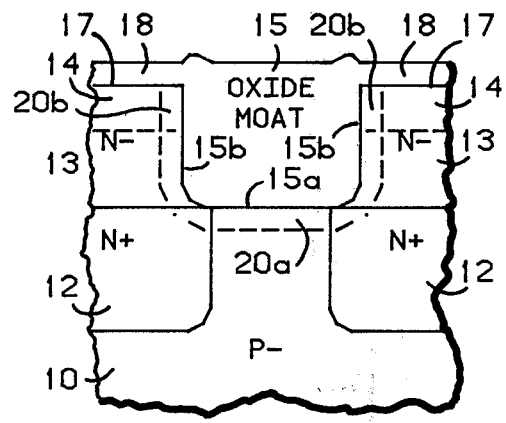
FIG 1B
FIG 2B
—PRIOR ART—

SELF-ALIGNED BURIED CHANNEL FABRICATION PROCESS

TECHNICAL FIELD

This invention relates to the fabrication of semiconductor device and integrated circuit structures requiring buried channels, more particularly to the fabrication of buried channels which underlie an epitaxial region, or an oxide moat region of a semiconductor device.

BACKGROUND OF THE INVENTION

In the development of semiconductor devices, particularly those for use in integrated circuits, it is frequently desirable to obtain a structure wherein two independent regions of the same conductivity type overlying a region of opposite conductivity type, are separated by a thick oxide filled region called an oxide moat. Thus, for example, two n-type regions would be separated by an oxide moat overlying a p-type substrate. The oxide moat is ordinarily prepared by the selective oxidation of the semiconductor and is carried to such a depth that its bottom surface intersects the substrate. Because the solubility of impurities in the oxide and in the semiconductor are different, there is, during the oxidation process, a tendency for the impurity concentration in the semiconductor adjacent to the growing oxide region to be either depleted or enhanced. Thus, real structures differ significantly from ideal structures in terms of the impurity concentrations in the doped regions surrounding the oxide moat. In the example mentioned earlier, boron is typically depleted from the p-type substrate beneath the oxide moat so that an approximately intrinsic region is formed. The built-in charge in the oxide typically causes the intrinsic region to form a parasitic n-channel connecting the two n-type regions on either side of the moat, thus interfering with proper operation of the device or circuit.

In the prior art, various techniques have been utilized to overcome this problem, the most common being to dope the moat region prior to oxidation. For example, using p-doping one can overcome depletion effects in a p-region underlying an oxide moat. However, at the same time, this approach creates a p-skin in the n-regions which form the sidewalls of the oxide moat, thus creating a new set of problems which are frequently as intolerable as the original problem. Additionally, it is generally desirable to have a process for producing buried doped regions of arbitrary conductivity and type (e.g., channels under an epitaxial layer) which self-align with other abutting buried regions.

Thus a need continues to exist for a fabrication process which can locally dope a semiconductor region underlying an oxide moat or an epitaxial layer so as to overcome either enhancement or depletion effects associated with oxidation and which does not result in the formation of undesirable parasitic channels at other locations, or which can provide channels of arbitrary conductivity and type buried within the structure, that are self-aligned with and abutting other doped regions.

Therefore, it is an object of this invention to provide an improved process for forming in a semiconductor wafer a selectively doped buried region of a second dopant abutting a region of a first dopant.

It is an additional object of this invention to provide an improved process for forming a selectively doped buried region underlying an oxide moat in a semiconductor structure.

It is a further object of this invention to provide an improved process for forming a selectively doped buried region without creation of parasitic doped regions in other locations in the semiconductor structure. It is an additional object of this invention to provide an improved process for forming a selectively doped buried region, which is self-aligning, which does not require additional masking steps, and which facilitates subsequent alignment steps.

SUMMARY OF THE INVENTION

In a preferred embodiment of the invention, a silicon wafer is coated with a first mask pattern which is resistant to oxidation and to a first type of dopant impurity. A first type dopant is applied to a predetermined depth through the openings in the first mask pattern. A second mask pattern is created by oxidizing the silicon exposed through the openings in the first mask pattern, this oxidation being carried out until a thickness substantially greater than the thickness of the first mask pattern is obtained. Since the second mask pattern is formed in the openings of the first mask pattern, the two mask patterns are self-registering and no additional alignment step is required. A second dopant which is desired to be obtained under the oxide moat regions or in a buried channel is then applied to the wafer so that it penetrates to a predetermined depth in the regions not covered by the second mask pattern. The two mask pattern layers are then removed and a layer of epitaxial silicon of predetermined conductivity and type grown on the wafer to a predetermined thickness. Tubs or moats can be etched in the surface of the epitaxial layer and oxidized so as to form an oxide-filled moat (oxide moat) in a desired location overlying the desired doped region or channel.

BRIEF DESCRIPTION OF THE DRAWINGS

FIG. 1A is a top view in schematic form of a region of a semiconductor device in which several n-and p-type regions are separated by an oxide moat;

FIG. 1B is a cross-section of the device of FIG. 1A along line 1B—1B;

FIG. 2A is a top view similar to FIG 1A but showing the location of parasitic sidewall channels along the oxide moat, resulting from the prior art method of doping the moat region prior to oxidation;

FIG. 2B is a cross-section along line 2B—2B of the device of FIG. 2A showing the desired and parasitic channels obtained by the prior art method;

DETAILED DESCRIPTION OF THE PREFERRED EMBODIMENT

Figure 3A:
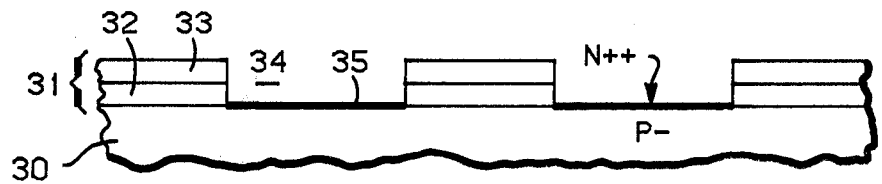
FIGS. 3A–F are cross-sectional views illustrating the process sequence of the present invention.

In the discussion which follows, the prior art and the present invention are illustrated primarily for the case of a p-type substrate containing n-type regions separated by an oxide moat and p-type regions within the n-type regions. Since many combinations are possible within the scope of the present invention, the particular illustrations given are intended to be exemplary and not limiting.

FIGS. 1A and 1B are schematic illustrations of a desired result of a semiconductor device structure with an oxide isolation moat, FIG. 1A being a top view and FIG. 1B being a cross-section at line 1B—1B of FIG. 1A. The device of FIG. 1A–1B may be constructed by methods well known in the art in which n+ regions 12 are diffused into substrate 10 followed by growth of n− epitaxial layer 13 in which is formed oxide moat 15. Additional device structures can be constructed in n-type surface 17 covered by passivating oxide 18 as exemplified by shallow p-type diffusions 14. Oxide moat 15 is typically formed by thermal oxidation of an etched tub or moat region in the silicon wafer using methods well known in the art. During this oxidation process the p-type dopant present in substrate 10 is depleted in region 11 near the oxide-semiconductor interface below the oxide moat, due to the higher solubility of the p-type dopant boron in the oxide as compared to the semiconductor. Region 11 is thus rendered nearly intrinsic and in the presence of oxide charge or applied charge or small potential differences between n+ regions 12a and 12b, a parasitic channel exists adversely affecting the characteristics of devices subsequently constructed in surface 17.

Prior art attempts to overcome the formation of parasitic channel 11 have followed the practice of doping the tub or moat etched in the epitaxial layer prior to oxidation and give the result illustrated in FIG. 2A–2B. For example, additional p-type impurity is used to compensate for the depletion effects during oxidation. This p-dopant is driven into the silicon prior to oxidation. During moat oxidation, silicon is consumed but some p-type dopant remains in the silicon ahead of oxidation interface 15a–b so that when oxidation is complete a thin layer of enhanced p-type doping 20a–b is present around moat 15. This successfully compensates for the depletion effect which previously occurred in region 11. However, sidewall region 15b is also doped with p-type impurity which can produce thin p-type skin 20b along sidewalls 15b and undesirable parasitic channel 20b coupling p-regions 14. The severity of parasitic channel 20b depends upon the initial doping level in n-type epitaxial layer 13 and the amount of dopant added prior to oxidation. While devices can be successfully constructed by this technique, it is difficult to control and has an adverse effect upon the yield of devices and circuits.

The deficiencies of the prior art methods may be avoided by the present invention following the process sequence illustrated in FIG. 3. P-type silicon substrate or wafer 30 is covered by first mask pattern 31 which is impervious or resistant to oxidation and a first dopant species, in this example an n-type impurity. Layer 31 is conveniently composed of silicon dioxide layer 32 formed on silicon substrate 30 surmounted by silicon nitride layer 33, the combination being patterned using techniques well known in the art to produce openings 34 in which n-type dopant source 35 is deposited. Oxide layer 32 may be a few tens to a few thousands Angstroms in thickness. In a subsequent step, ion implantation may optionally be carried out through layer 32, and if so, large thicknesses should be avoided. 1000 Angstroms ($10^{-5}$ cm) is a suitable value. Silicon nitride layer 33 may be of a few hundred to a few thousand Angstroms thick, with 1000 Angstroms ($10^{-5}$ cm) being a suitable value. In any case, a sufficient thickness to inhibit oxidation of the underlying silicon must be utilized.

Other material combinations may be used for first mask pattern layer 31. For example, layer 32 can be any material resistant or impervious to oxidation which does not adversely dope wafer 30. Layer 33 can be a photoresist layer of sufficient thickness to permit etching of openings 34 and to act as a mask during ion implantation to form dopant source 35. The resist layer is conveniently removed before subsequent processing.

Figure 3B:
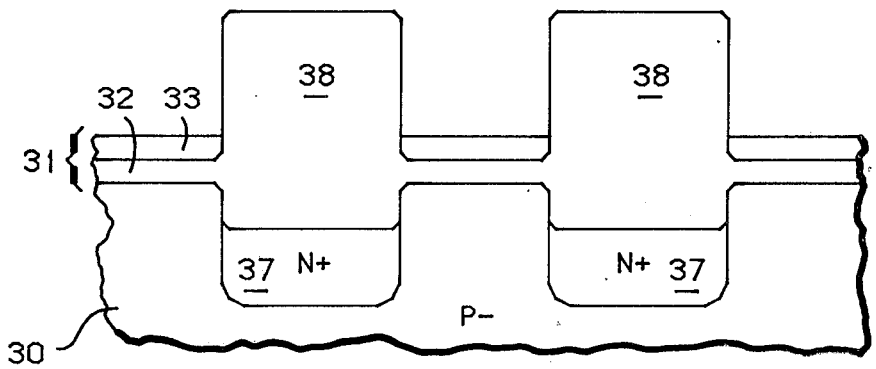
Figure 3C:
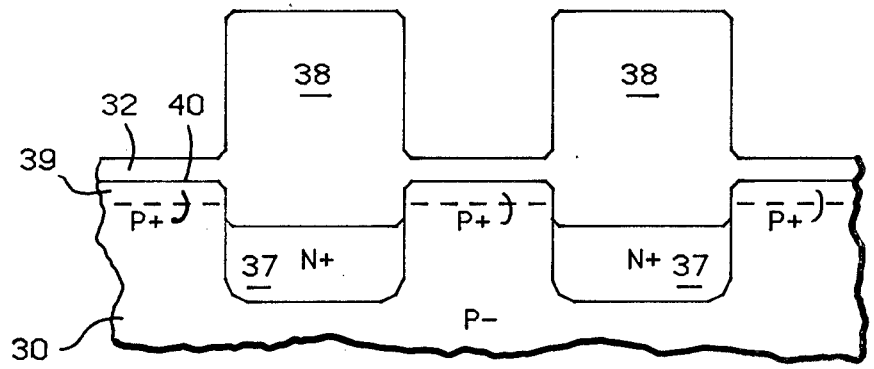
Figure 3D:
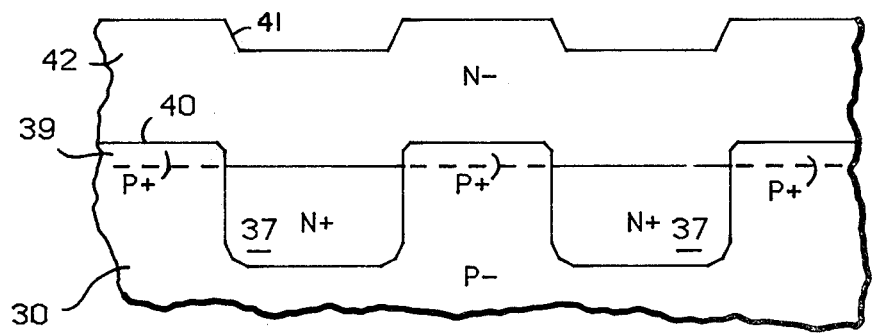

The structure illustrated in FIG. 3A is in FIG. 3B conveniently subjected to a thermal diffusion or "drive" step to produce, from n-type dopant source 35, first doped region 37 of predetermined depth. An oxidation process is conveniently used to grow thick oxide region 38 in openings 34 of first mask pattern layer 31. Both steps are carried out by methods well known in the art. Thick oxide region 38 forms a second mask which is automatically aligned and coincident with apertures 34 of first mask pattern 31 without any additional alignment steps. Since the second mask layer is formed in the openings of the first mask layer, the two layers (or their openings) are complementary, one being the inverse of the other.

Silicon nitride layer 33 is conveniently removed (FIG. 3C) to facilitate ion implantation of a second doped region 39 (p-type) into those regions of substrate 30 not protected by thick oxide regions 38 (second mask pattern). The thickness of oxide regions 38 (second mask pattern) must be sufficient to prevent doping of underlying region 37 during ion bombardment, and depends upon the ion bombardment energy chosen and the relative thickness of oxide layer 32. The proper thickness may be readily determined by techniques well known per se in the art for the ion implant equipment and conditions being used. In conjunction with a 1000 Angstroms ($10^{-5}$ cm) thick oxide region 32, a 5000 Angstroms ($5 \times 10^{-5}$ cm) thick oxide region 38 was found to be a convenient value. Ion implant doping of region 39 can also be carried out without removal of silicon nitride layer 33, in which case it is desirable that the second mask pattern (region 38) be at least twice as thick as the first mask pattern (region 31). However, greater differentiation between doped and undoped regions is obtained if layer 33 is removed.

Alternatively, oxide regions 32 may be removed by a brief dip etch, and second doped region 39 obtained by a conventional thermal diffusion operation, both methods well known in the art. Thick oxide region 38 must then be of a thickness to retain sufficient oxide after the brief dip etch to prevent doping of region 37. A thickness of 3000–10,000 Angstroms ($3-10 \times 10^{-5}$ cm) is suitable.

First and second mask pattern layers (31 and 38) are removed (FIG. 3D) and epitaxial silicon layers or region 42 of predetermined conductivity type (n— in this example) and thickness is grown over exposed silicon surface 40 so as to cover wafer 30 with a substantially uniform epitaxial layer. Methods to accomplish this are well known in the art.

Figure 3E:
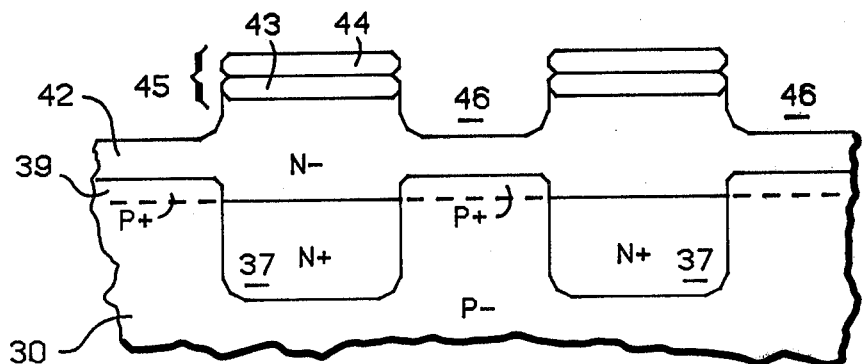
Figure 3F:
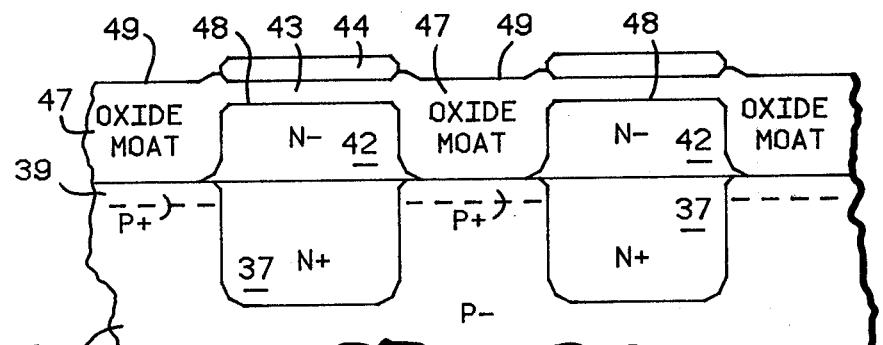

Oxide moat structures 47 are then prepared as shown in FIGS. 3E–F wherein third mask pattern layer 45 composed typically of underlying oxide layer 43 and surface nitride layer 44 is formed so as to permit etching of tubs or moats 46 in silicon epitaxial layer 42 to an appropriate depth so that when oxidized the additional volume occupied by the oxide is sufficient to produce approximately planar surfaces 49 on oxide moat 47. Semiconductor surfaces 48 of epitaxial layer 42 are then available for construction of further device structures as, for example, the inclusion of p-type doped regions 14 of FIG. 1. Methods for the preparation of silicon tubs 46 and resulting oxide moats 47 are well known in the art. An alignment step is required, as in the prior art.

It will be apparent to those skilled in the art that the invented method illustrated in FIG. 3 can be practiced with various combinations of n or p-type starting material and n or p-type dopants, and a variety of different geometric configurations for the several masking layers. In particular, region 39 may be doped to the same conductivity type as substrate 30 so as to preclude formation of parasitic channels, or may be doped to the opposite conductivity type of substrate 30 so as to deliberately provide a buried channel in order to accomplish specific device functions. Similarly, regions 37 and 42 may be of the same or different conductivity types depending upon the device function desired.

It is also apparent that the present method overcomes the deficiencies of the prior art techniques in that no parasitic channels form along the sidewalls of oxide moats 47, since no sidewall doping step need be carried out prior to moat oxidation. As is true with prior art techniques, a mask alignment step is required for third mask pattern layer 45 to locate oxide moats 47 between buried n+ regions 37 formed prior to growth of epitaxial layer 42. However, in the case of the invented method, alignment of third mask pattern 45 relative to first mask pattern 31 is greatly facilitated by surface irregularities 41 (see FIG. 3D) of epitaxial layer 42 which conform to and reveal the outline of buried n+ regions 37 as a result of the silicon consumed from the surface during the formation of thick oxide regions 38. This contributes to increased packing density which may be achieved using the inventive method since a smaller mask alignment tolerance is possible. The surface irregularities present on epitaxial layer 42 prior to etching of tubs 46 may be compensated, using methods well known in the art, by control of the depth of etched tub 46 and the refill growth of oxide moat 47 so as to give approximately planar surface 49. Remaining nitride layer 44 may be removed if desired prior to subsequent processing.

Figure 4:
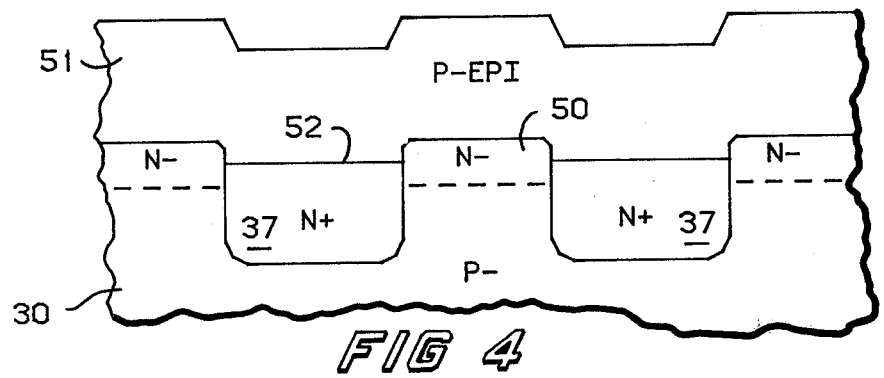
FIG. 4 is a cross-sectional view of an alternative embodiment of the process sequence illustrated in FIGS. 3A–D.

While the invented process is particularly useful for providing buried doped regions or channels under oxide moats, the method is also applicable for providing buried channels of arbitrary conductivity and type which abut and self-align with pre-existing doped regions. This is illustrated for one choice of conductivity types in FIG. 4, wherein p-type substrate or wafer 30 has received first doped region 37 of n-type doping and second doped region 50 also of n-type doping overlayed by p-type epi-layer 51, so as to form buried channel 50 between abutting regions 37. Region 50 is desirably doped to a sufficient depth so that junction 52 between regions 37 and 51 intersects region 50. This is readily accomplished. It wil be apparent to those skilled in the art that the structure of FIG. 4 is accomplished by the process illustrated in FIG. 3A–D with an alternative choice of dopant types.

Thus, it is apparent that there has been provided in accordance with this invention an improved method for forming selectively doped buried regions underlying an oxide moat or an epitaxial layer in a semiconductor structure without the creation of parasitic doped regions elsewhere in the structure. Further, the invented process is self-aligning, does not require additional masking steps and, moreover, facilitates the mask alignment steps required for the preparation of the oxide moats.

While the invention has been described in terms of certain materials, structures and illustrative combinations of n and p-type regions, it will be apparent to those skilled in the art that the invented method is useful with other combinations and a wide variety of device geometries and structures which may differ in detail but preserve the central relationships. Accordingly, it is intended to encompass all such variations which fall within the scope of the invention.

I claim:

1. A process for providing in a semiconductor wafer a buried region of a second dopant abutting a region of a first dopant, comprising the steps of:
   forming on said wafer a first mask pattern resistant to oxidation and a first dopant, and having at least a first opening;
   applying said first dopant through said first opening;
   forming without further mask alignment a second mask pattern coincident with said first opening having at least a second opening complementary to said first opening;
   applying a second dopant through said second opening;
   removing said first and second mask patterns; and
   forming an epitaxial layer of a predetermined conductivity type and thickness on said semiconductor wafer.

2. The process of claim 1 wherein said first forming step further comprises forming a sandwich of a silicon dioxide layer on said wafer and a silicon nitride layer on said silicon dioxide layer.

3. The process of claim 2 further comprising the step of removing said silicon nitride layer prior to applying said second dopant.

4. The process of claim 1 wherein said second forming step further comprises forming said second mask pattern by oxidizing said wafer through said first opening in said first mask pattern layer.

5. The process of claim 4 wherein said second mask pattern formed by oxidation is at least twice as thick as said first mask pattern.

6. The process of claim 1 wherein said second dopant is of the same conductivity type as said semiconductor wafer and of opposite conductivity to said first dopant.

7. The process of claim 1 wherein said second dopant is of opposite conductivity type to said semiconductor wafer and of the same conductivity as said first dopant.

* * * * *